United States Patent [19]
Truett

[11] Patent Number: 5,253,228
[45] Date of Patent: Oct. 12, 1993

[54] INTERVAL TIMER

[76] Inventor: Brett B. Truett, 1908 Briar Ave., Utica, N.Y. 13501

[21] Appl. No.: 833,554

[22] Filed: Feb. 10, 1992

[51] Int. Cl.⁵ .......................... G04C 19/00; G04F 8/00
[52] U.S. Cl. ........................ 368/82; 368/107; 368/239
[58] Field of Search .......... 368/76, 79, 82-84, 368/223-232, 239-242

[56] References Cited
U.S. PATENT DOCUMENTS 3,775,964 12/1973 Fukumoto ............................. 368/79
3,852,949 12/1974 Satler ................................... 368/79
4,070,819 1/1978 Kelly ................................... 368/239
4,161,098 7/1979 Ingendahl ............................. 368/79

Primary Examiner—Vit W. Miska
Attorney, Agent, or Firm—Wall and Roehrig

[57] ABSTRACT

An electronic interval timer in which a cylindrical shell having five rows of LEDs mounted at spaced intervals from top to bottom, formed every 72° about the circumference simulates an hourglass timer. Timer and control circuits are connected to select a desired time interval and to illuminate the LEDs and turn off successive rings in proportion to the time remaining in the selected interval at any given time after actuation. An audible buzzer is also provided as are interrupt and reset capabilities.

10 Claims, 6 Drawing Sheets

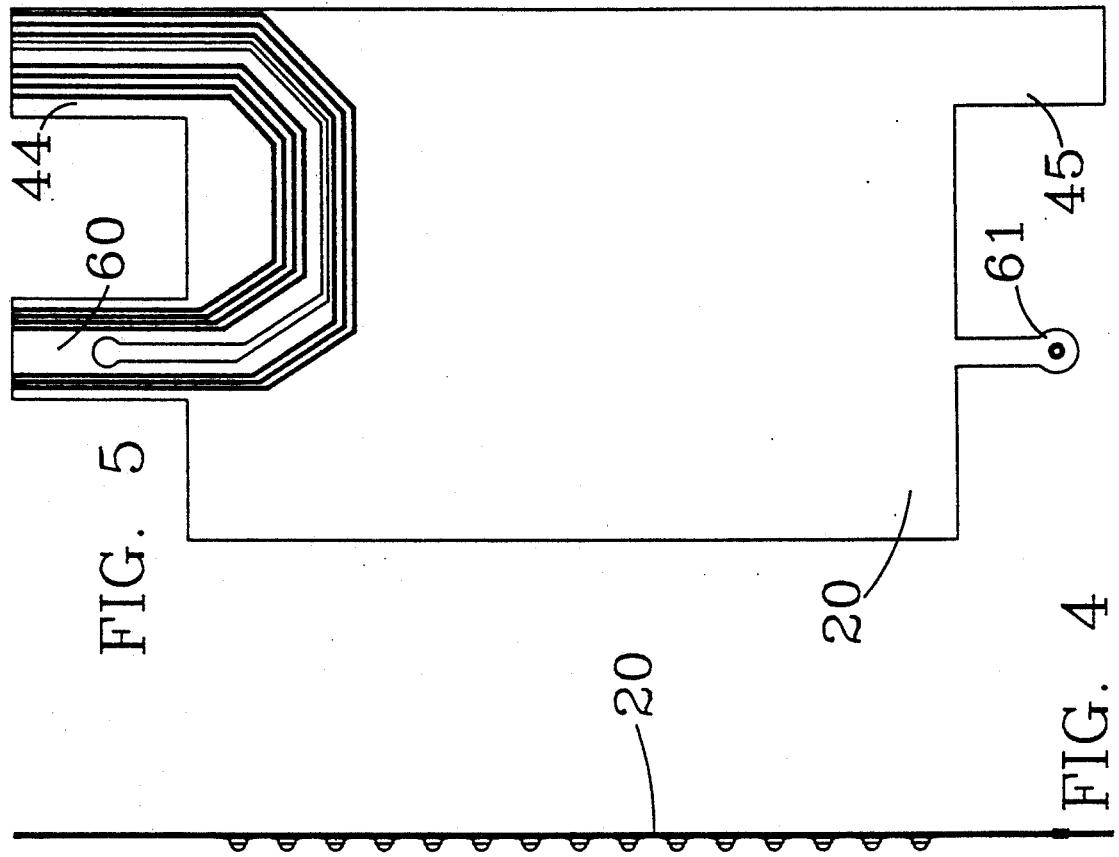
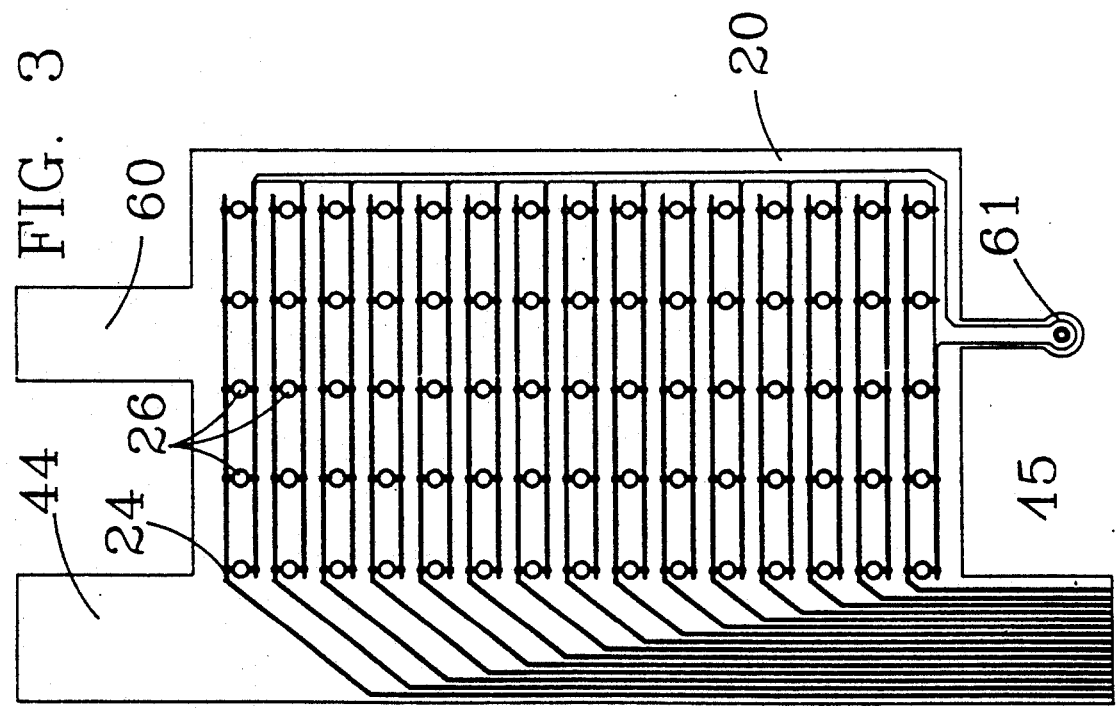

INTERVAL TIMER

BACKGROUND OF THE INVENTION

This invention relates to a timer for timing intervals of preselected duration and displaying the time elapsed within the interval and both visually and audibly, indicating termination of the preselected interval. More particularly, this invention relates to an electronic "hour glass" for use with various types of games and other activities that must be accomplished within designated time intervals.

PRIOR ART

Traditionally, there have been many types and styles of portable timer devices, starting with the well-known hour glass, in which small particles of sand have been allowed to pass from an upper compartment into a lower compartment through a restricted orifice, to sophisticated electronic timing devices which can indicate minutes, seconds, nd fractions of seconds. Generally these devices have consisted of windable clock-type devices or programmable electronic numeric display devices, some with audible signals such as a bell or buzzer to indicate the expiration of the selected time interval. Disadvantages encountered with most of the aforementioned devices have included the fact that it is difficult to quickly perceive how much time remains in a selected interval since one has to interpret interval marks on a dial and visually locate the position of the time indicator, i.e., clock hands. Interpretation is also hindered by the fact that these devices must be viewed from a narrowly defined vantage point and are not readily comprehended from a distance. Another disadvantage of existing devices is that when having to rely on an auditory indication of the expiration of the time interval, a person who is hearing impaired has difficulty using the device. This is especially so where a single alarm is sounded at the end of the interval, as is common with many of the more popular and economical devices currently available. Devices such as the sand-filled hour glass "egg timer" have no output other than a close visual observation and it is difficult to estimate the time remaining in the interval with any accuracy. Other limitations and difficulties with the prior art include difficulty of interrupting an interval or once interrupted, resuming the balance of the interval that had not expired. These problems are all compounded in the devices currently on the market.

OBJECTS AND SUMMARY OF THE INVENTION

It is accordingly an object of the present invention to overcome the shortcomings of existing interval timers.

It is another object of the present invention to provide an interval timer that visually, graphically and audibly indicates the passage of a selected time interval in an economical, easy to use manner.

It is another object of the present invention to provide an interval timer that visually displays the proportion of the original time interval left at any given moment in the interval being timed.

It is another object of the present invention to provide an interval timer that can be quickly and easily observed from 360° around the device.

It is another object of the present invention to provide an interval timer that can be readily observed and interpreted at a substantial distance without need of any special visual skills.

It is another object of the present invention to provide an interval timer that can be interrupted and restarted without loss of originally selected interval, and elapsed time within the interval, and in which the timed interval can be resumed when desired.

These and further objects of the present invention are attained in one embodiment by the provision of a small vertical cylinder having five vertical rows of lights, equally distributed about the circumference of the cylinder. Each row has fifteen lights spaced at equal intervals throughout the vertical height of each row to form "horizontal rings". The individual horizontal rings of lights are turned on and off sequentially in accordance with a preset timer circuit to indicate passage of time. When the start button is pushed, all lights will be illuminated and when the interval is finished, an audible alarm will be sounded and selected lights flushed on and off. The five vertical rows around the circumference of the cylinder permit ready visual observation from any angle and at extended distances without the need for close visual examination of the device. The circuitry automatically spreads the selected time interval across the number of lights available in the vertical rows. Circuitry is also provided for stopping, starting, restarting, and resetting instantaneously any function of the device. Light emitting diodes are used for the lights. The lights may be all the same color or portions color coded from top to bottom to further graphically indicate the progression of the time interval.

BRIEF DESCRIPTION OF THE DRAWINGS

Further objects of the invention, together with the advantages accruing therefrom will be apparent from the following description of a preferred embodiment, which is shown in the accompanying drawings, wherein:

FIG. 3 is a plan view of the flexible PCB showing the LED's;

FIG. 4 is an end view of the flexible PCB board of FIG. 3;

FIG. 5 is a plan view of the reverse side of FIG. 3;

DETAILED DESCRIPTION OF A PREFERRED EMBODIMENT

Figure 1:
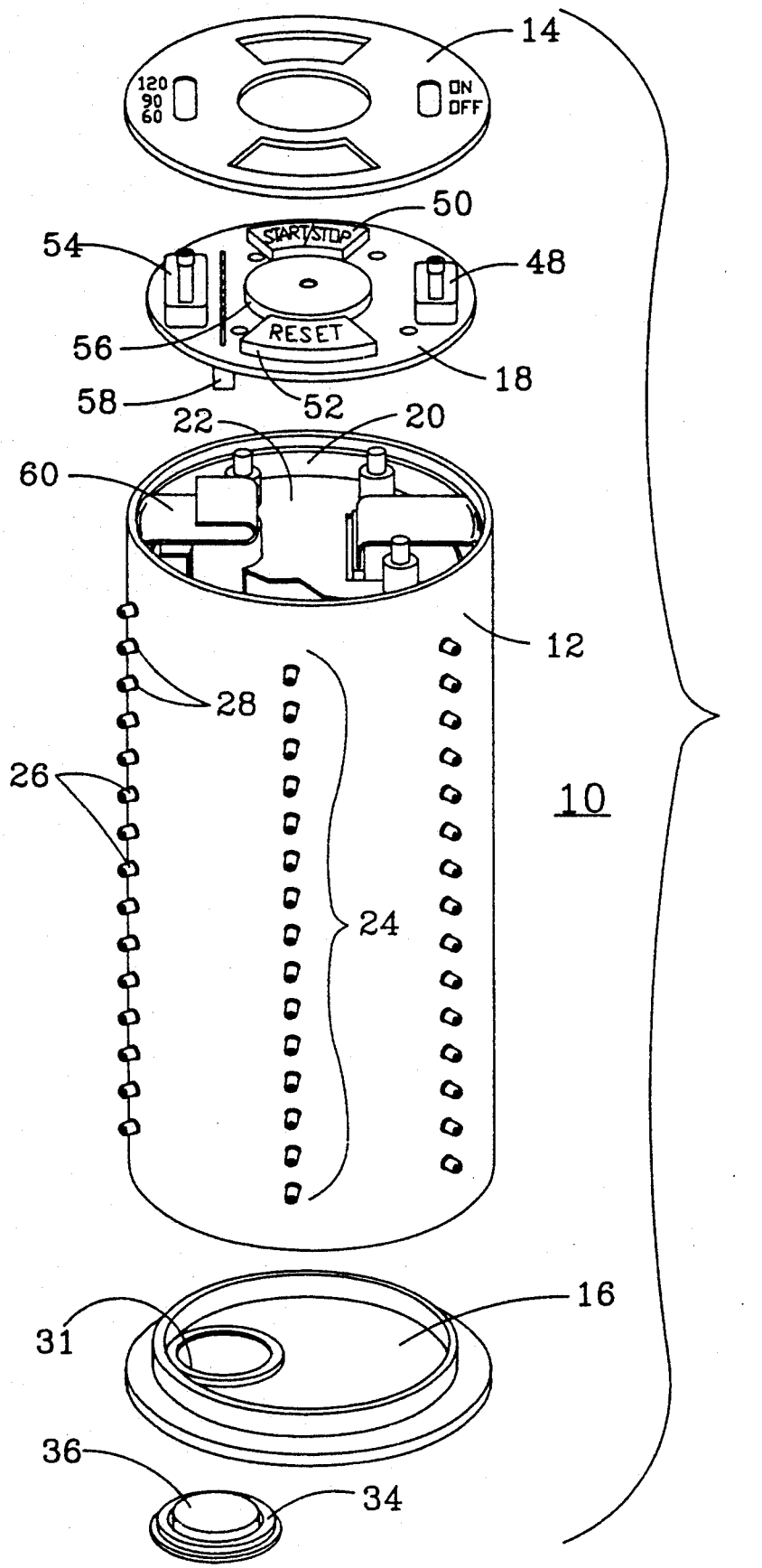
FIG. 1 is an exploded perspective view of a device according to the present invention.

Referring now to FIG. 1, the timer 10 comprises generally an outer housing 12 having a top 14 and a bottom 16 and an interface printed circuit board 18 positioned underneath the top 14 of the cylindrical outer housing 12. A flexible printed circuit board 20 (FIGS. 1 and 3) is positioned within the outer housing 12 and held therein by inner housing 22. PCB 20 carries thereon five vertical annunciator rows 24 of fifteen LED's 26 which are adapted to extend through five corresponding rows of apertures 28 in the outer housing 12 when printed circuit board 20 is mounted therein.

This printed circuit board 20, as will be described in more detail herein, carries the electrical connections to the LED's and to certain other components of the timer. The printed circuit board 20 is formed into a cylinder and held within the outer housing 12 by the inner housing 22 which is a tubular plastic insert adapted to insulate and to position the flexible printed circuit board 20 with the LED's in the appropriate apertures 28 in the housing 12. The rows 24 of LED's 26 on the printed circuit board 20 act as visual annunciators and can be sub-miniature lights, a continuous column of LEDs, or other indicator device. Chemical liquids and/or solids which can change color or physical state to indicate elapse of time can be used as annunciator means. Color can be varied from top to bottom, as will be described in more detail herein. In addition to the visual annunciator rows 24, an aural annunciator or voice signal may be provided along with the lights to indicate the passage of various time intervals. The "buzzer" herein could easily be replaced with an appropriate voice signal.

Figure 2:
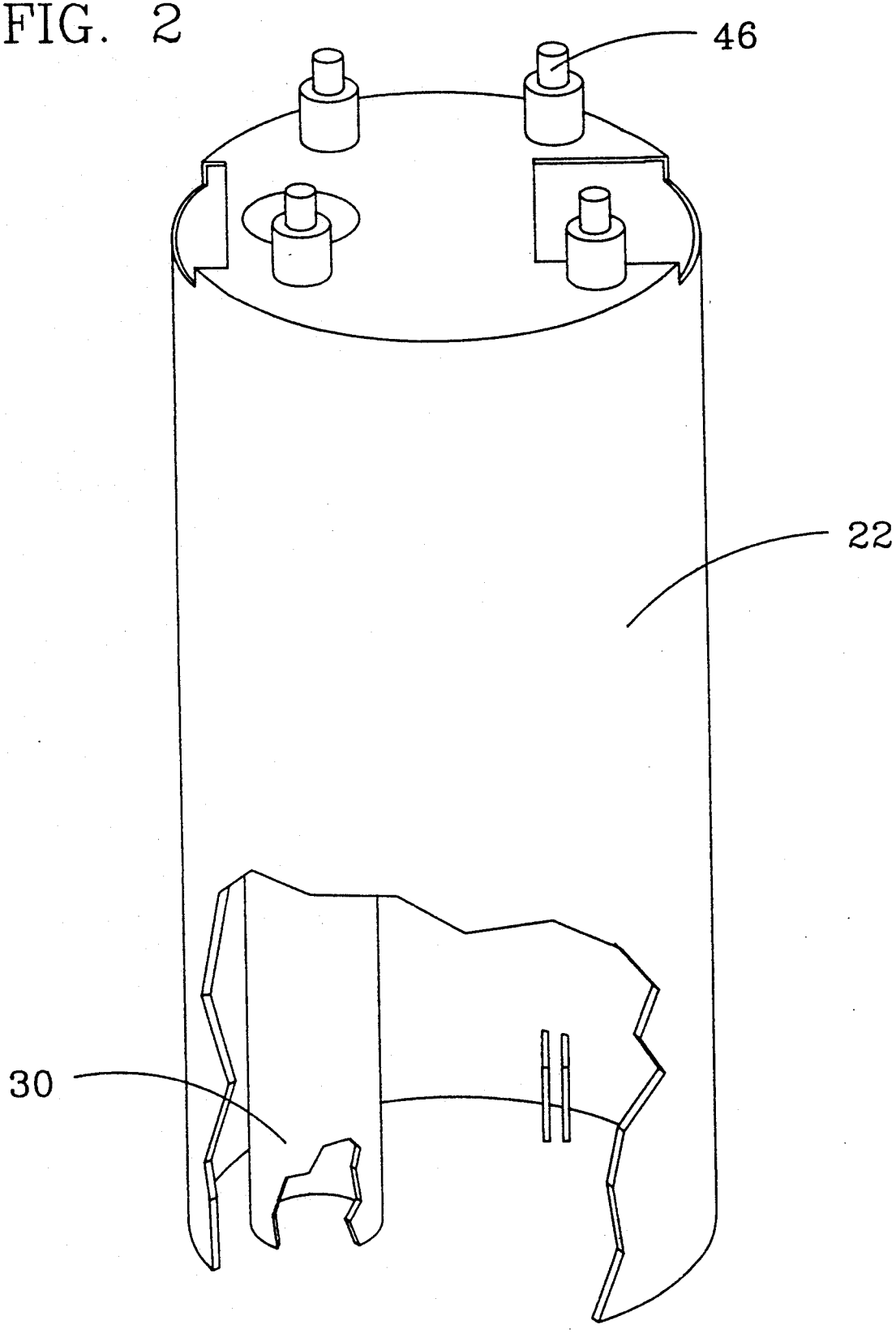
FIG. 2 is a perspective view of the inner housing.
Figure 7:
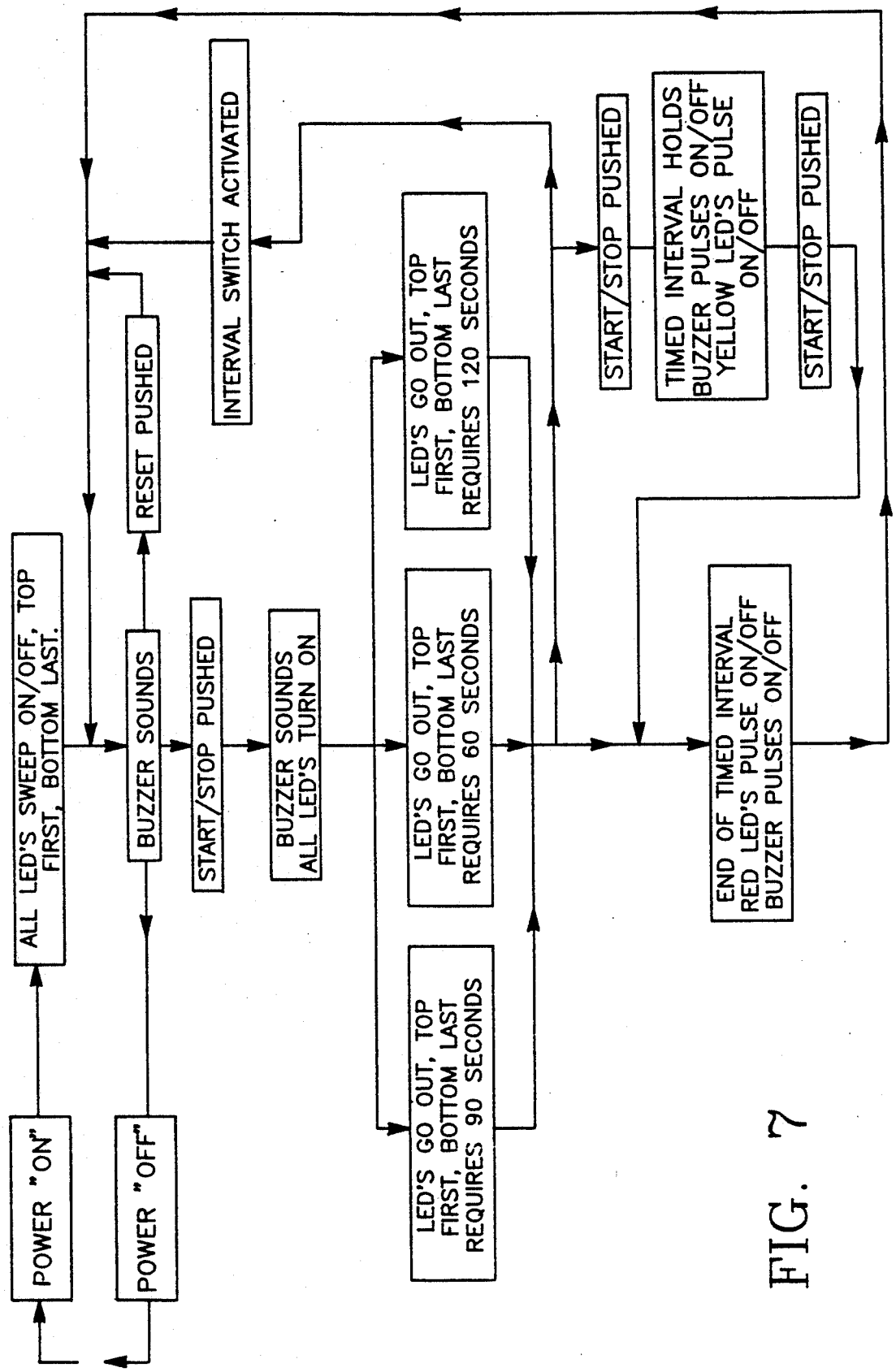
FIG. 7 is a block diagram of the control sequence of the present invention.
Figure 8:
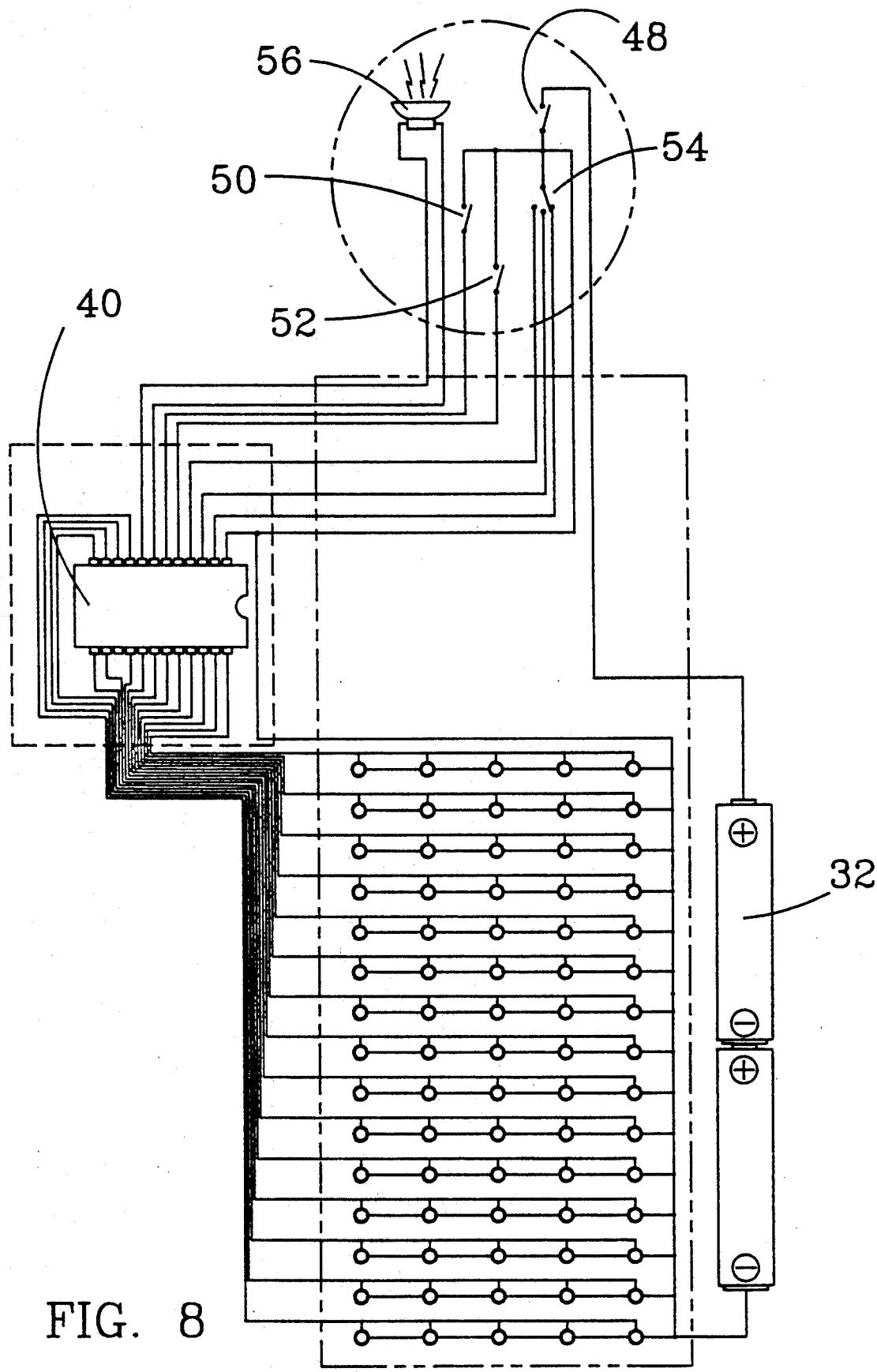
FIG. 8 is a circuit diagram showing the connections from the processor chip, switches, alarm and batteries with the various rings of lights in the five vertical rows of the sleeve.

The inner housing 22 (FIG. 2) has a sleeve 30 molded therein which carries batteries 32 (FIG. 6) which are positioned within the sleeve 30. A suitable battery cap 34 and foam pad 36 are formed in the housing bottom 16 for positioning the batteries 32 within the sleeve 30. A small microprocessor board 38, for operating the timer, has mounted thereon the chronometer and control chip 40 which is used to control the interval timer. The board 38 carries on the ends thereof connectors 42 and 43 which are adapted to mate with contact tabs 44 and 45 formed in the flexible printed circuit board 20, as will be described in more detail herein. The inner housing 22 carries a set of four studs 46 on its top side which are adapted to locate and to secure the interface printed circuit board 18 on the top of the inner housing when it is installed within the outer housing. This properly positions and orients the interface printed circuit board 18 so that the housing top 14 can be installed and secured to the housing in proper alignment therewith. As can be seen in FIG. 1, a suitable on/off switch 48 is provided, together with a start/stop switch 50, a reset switch 52 and an interval selector switch 54. These are all connected together as is shown in FIGS. 7 and 8, and as will be described in more complete detail herein.

The outer housing 12, the inner housing 22, the top 14, and bottom 16 are generally made of an injection molded plastic with the desired legends imprinted or painted thereon, as the case may be. The user interface printed circuit board 18 is usually an epoxy glass wafer carrying on the one side, in addition to the switches indicated above, a small solid state buzzer 56. The other side of PCB 18 has formed thereon the conductor runs for connecting the components in the proper sequence within the circuit, as will be described herein in connection with FIG. 8. The printed circuit board 18 also has a connector 58 which mates with the contact tab 60 on the flexible printed circuit board 20 for completing the circuit thereto.

The outer housing 12 has five vertical rows of holes 28 formed at equally spaced intervals around the circumference. These holes 28 are sized and positioned so as to allow the LEDs 26 on the flexible printed circuit board 20 to extend therethrough and be visible outside the housing 12. The top 14 and bottom 16 are formed so as to fit snugly within the outer housing 12 and are usually cemented or otherwise secured therein.

Figure 6:
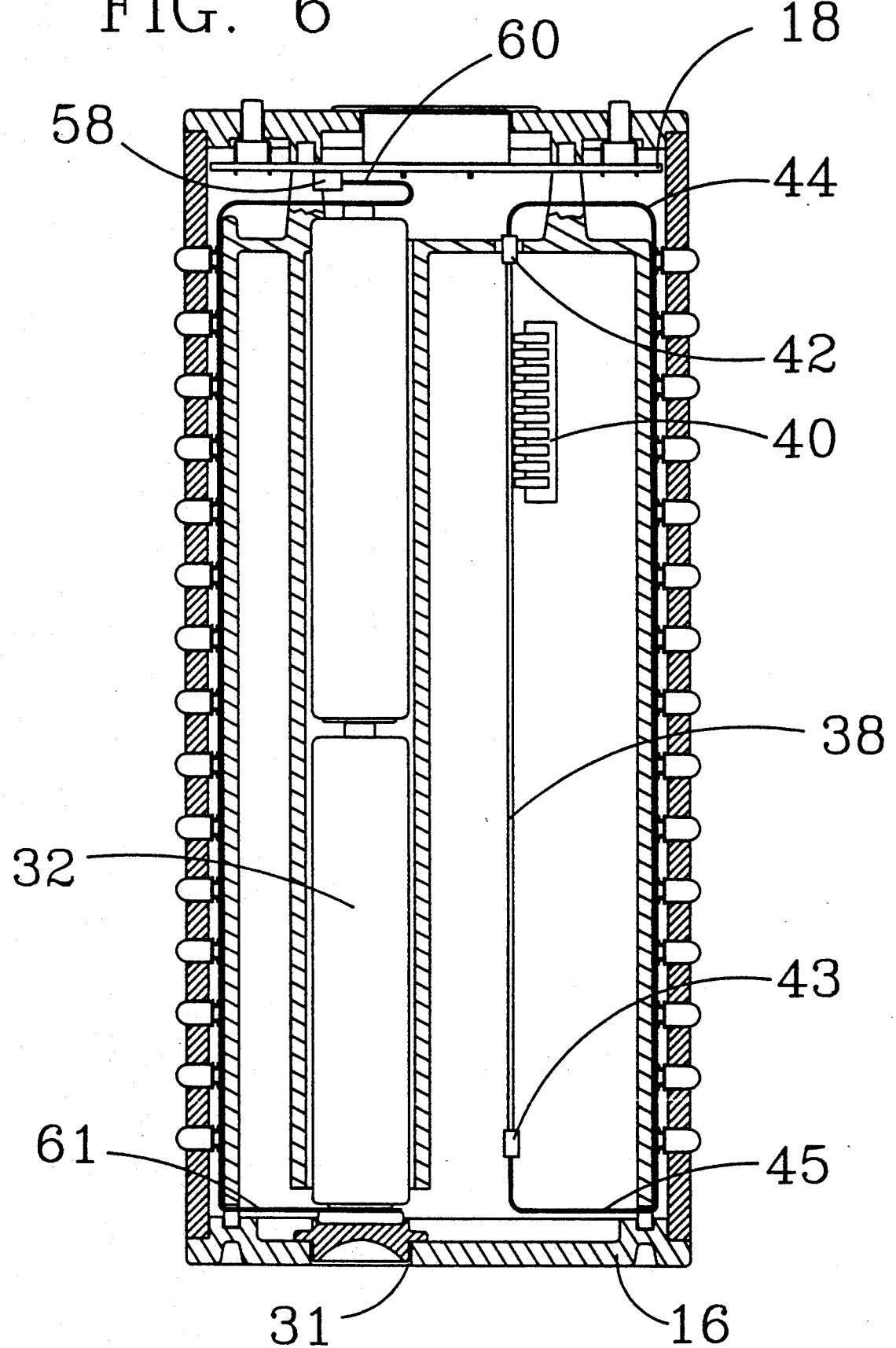
FIG. 6 is a cross sectional view of the assembled device taken on a diameter of FIG. 1.

The flexible printed circuit board 20 shown in FIGS. 3-5 is formed of a thin mylar plastic sheet and carries on the one surface the light emitting diodes 26 soldered to their respective circuit runs to connect each ring of LEDs, as shown in FIG. 6, to the microprocessor chip 40 on board 38. This connection is made through the contact tab 45 and connector 43. The other side of the thin mylar plastic printed circuit board 20 carries another set of printed circuit runs formed to interconnect through contact tabs 44 60 and 61 to the microprocessor printed circuit board 38, the interface printed circuit board 18 and the batteries 32.

In use, PCB 20 is formed into a cylindrical sleeve which is then inserted within the outer housing 12 with the light emitting diodes positioned within the apertures 28 in the outer housing so as to emit light therethrough. Tabs 44, 45, 60 and 61 are bent over to the positions shown in FIG. 6 to make contact with the batteries and other circuit elements as described herein.

The inner housing 22 is a cylindrical plastic injection molded component and is designed to be inserted into the flexible PCB 20 when it is inserted within the outer housing. The housing has the top partially cut away so as to allow the contact tabs 44 and 60 of the flexible PCB 20 to be bent over to engage with connectors 42 and 58. The top of housing 22 carries thereon the four studs 46 for receiving and positioning the interface PCB 18 thereon.

The microprocessor PCB 38 is made of an epoxy glass substrate with printed circuits and an integrated circuit chip mounted thereon to control the LEDs, the buzzer, and the operation of the timer, as will be described herein. A "voice chip", if used, would also be mounted on PCB 38. The PCB 38 carries at each end connectors 42 and 43 for connection to the contact tabs 44 and 45 of the flexible PCB 20.

The housing bottom 16, (see FIG. 6) is a molded plastic, which as indicated fits into the bottom of the outer housing 12. The bottom 16 has a hole 31 adapted to coincide with the battery sleeve 30 and to receive the battery cap 34 therein so as to hold a pair of batteries 32 within the sleeve 30. A foam pad 36 is provided to cushion and to urge the batteries into electrical contact when installed in the sleeve 30 and the cap 34 is snapped into the hole 31 or otherwise secured in the bottom of the housing as is well known in the industry.

Referring now to FIG. 7, the operational logic is shown in block diagram form. The operation of the device is controlled by the microprocessor chip 40 and the switches on the top of the unit. The power on/off switch 48 is turned to the on position to apply battery power to the unit. This automatically will sweep the LEDs 26 in the five vertical annunciator rows 24 from the top to the bottom and sound the buzzer 56 to indicate that all elements are operational and the system is ready for use. If for some reason the buzzer does not sound or one of the annunciators rows 24 does not function or has a number of inoperative LEDs, the user knows that the device is not fully operational and can arrange to have it corrected or replaced, as the case may be. The next step in the operation is to select the time interval desired, and as shown in FIG. 1 this can be sixty, ninety, or one hundred twenty seconds in the illustrative embodiment. This selection having been made by positioning switch 54, the start/stop button 50 can be pushed at which point the buzzer 56 will sound and all LEDs 26 in the five annunciator rows 24 will turn on. The microprocessor chip 40 then controls the operation of the individual rings of LEDs in the rows and divides up the time interval chosen by the number of LED rings (15 in FIG. 1) and proceeds to turn out the light rings, one at a time, from the top to the bottom of the rows of annunciators. At the end of the selected time interval, the bottom circle of lights extinguishes and the time interval is signaled as over by another buzzer signal, and the bottom ring of lights flashing on and off. If desired, the buzzer signal could be replaced with a voice signal such as "time is up".

If during the selected time interval it is desired to pause or interrupt the cycle, the start/stop button 50 is pushed again and the time interval is then put on hold. The buzzer, along with one or more of the lights, is repeatedly turned on and off to indicate that the unit is on hold. At the end of the desired interruption, the start/stop button is pushed again, and the selected time interval picks up where interrupted and continues to the end as originally set.

At any time in a timing cycle the reset button 52 can be pushed, and it will automatically reset the entire system to a start position for any desired time interval. In normal operation after the end of a timed interval has been reached and the buzzer sounds and the bottom ring of LEDs flash on and off until the reset button 52 is pushed.

To further assist in determining "time remaining" the 15 LEDs in the annunciator rows 24 of the device can be divided into thirds, for instance, with each five rings of lights having a different color. Thus, in one embodiment, the top third of the LEDs are white, the middle third yellow, and the bottom third red. Thus a visual assessment of time interval remaining can be more easily made by a glance at the LEDs remaining illuminated.

It will thus be seen that I have provided a simple, economical and reliable interval timer for use in timing moves in games or other activities having a time limit. It is readily observable by a number of people from various positions about the timer without the need to read a calibrated scale with an indicator needle. An immediate visual indication of elapsed time and time remaining is instantaneously available from a full 360° around the timer making it particularly suitable for game playing situations and other participant activities.

While this invention has been explained with reference to the structure disclosed herein, it is not confined to the details set forth and this application is intended to cover any modifications and changes as may come within the scope of the following claims:

What is claimed is:

1. An interval timer for indicating passage of a preselected time period for use in timing activities to be accomplished within a designated interval which comprises:
   a cylindrical outer housing having a plurality of vertical rows of spaced apart small holes, and a top and bottom;
   a cylindrical inner housing sized to fit within said outer housing;
   a thin flexible printed circuit board adapted to be rolled into a cylinder to fit between said inner and outer housing;
   a plurality of rows of spaced apart LED's mounted on said thin flexible PCB to correspond to said holes in said outer housing so that they will project through said holes when assembled between said inner and outer housings; and
   said printed circuit board being rolled into a cylinder and positioned inside said outer housing with said LED's extending through said holes and said cylindrical inner housing being positioned within said cylindrical printed circuit board to secure it within said outer housing;
   circuit and control means mounted in said inner housing and operatively connected to said thin flexible PCB for generating a selected time interval and actuating sequentially selected LEDs in said plurality of rows of LEDs;
   so as to visually indicate the time remaining in a selected time interval upon actuation of the timer.

2. An interval timer according to claim 1 wherein said rows of spaced apart small holes are all equally spaced from top to bottom to form "rings" of holes positioned about said outer housing from top to bottom so that by turning on all LEDs in said holes and sequentially turning off the top ring of LEDs in proportion to the time remaining in a selected time interval a visual representation of the time remaining in the interval is presented.

3. An interval timer according to claim 1 wherein said plurality of vertical rows of holes and LEDs comprises five rows of 15 holes and LEDs each, equally spaced about the circumference of said outer housing.

4. An interval timer according to claim 1 including voice signal means for audibly indicating passage of selected time intervals.

5. An interval timer for indicating passage of a preselected time period for use in timing activities to be accomplished within a designated interval which comprises:
   a body member, comprising a vertical, outer housing, and having an external surface and an internal space for operating components for a timer;
   a plurality of indicator means for indicating the percentage of elapsed time in a preselected time interval comprising at least three vertical rows of spaced apart visual annunciators evenly positioned about a perimeter of said housing so as to be visible through an angle of at least 180°;
   electronic circuit means for actuating selected visual annunciators in said plurality of indicator means in a desired sequence;
   control means for turning said electronic circuit means on and off and for selecting a predetermined sequence of actuation; and
   interval selector means connected to said electronic circuit means for establishing said preselected time interval.

6. An interval timer according to claim 5 including sound annunciator means operatively connected to said interval timer for auidbly indicating time in the selected interval.

7. An interval timer according to claim 5 wherein said vertical outer cylindrical housing has at least three vertical rows of spaced apertures corresponding to said vertical rows of visual annunciators;
   an inner cylindrical PCB having a plurality of visual annunciators thereon, positioned to project through said apertures when said PCB is mounted inside said cylindrical housing;
   circuit means for sequentially interconnecting certain of said visual annunciators on said cylindrical PCB;
   an inner cylindrical housing sized to hold said cylindrical PCB in position in said cylindrical housing when inserted therein;

top and bottom members for closing said cylindrical outer housing;

microprocessor means mounted within said inner cylindrical housing and operatively connected to said visual annunciators; and battery means mounted within said inner housing for operating the interval timer.

8. An interval timer according to claim 5 wherein said electronic circuit means comprises:

switching means operatively connected to said vertical rows of visual annunciators for progressively actuating individual annunciators of each row at intervals proportional to the elapsed time of the selected time interval;

so that the time remaining in a selected interval is visually displayed in graphic form.

9. An interval timer according to claim 8 wherein said rows of visual annunciators comprise a series of lights positioned one on top of the other at spaced intervals;

and said electronic circuit means includes means for sequentially turning on and off each light in each row in a top to bottom sweep upon initial turning on of the interval timer and then upon starting of the timing cycle, turning on all the lights and progressively turning off the top "ring" of lights around the body member at intervals proportional to the time remaining until all the lights are extinguished indicating expiration of a selected time interval.

10. An interval timer according to claim 7 wherein said cylindrical PCB comprises:

a thin, flexible, printed circuit board member;

a plurality of electrical conductor runs formed on a first side of said printed circuit board member;

a plurality of electrical conductor members formed on a second side of said flexible printed circuit board member;

said plurality of visual annunciator elements being mounted on said first side of said board member and connected to selected conductor runs on said first side;

so that when said board is rolled into a cylinder it will fit inside said cylindrical outer housing in operative relation therewith with said visual annunciators visible through said apertures.

* * * * *